(12) United States Patent
England et al.

(10) Patent No.: US 10,283,487 B2
(45) Date of Patent: May 7, 2019

(54) METHODS OF FORMING INTEGRATED CIRCUIT PACKAGE WITH THERMALLY CONDUCTIVE PILLAR

(71) Applicant: GLOBALFOUNDRIES Inc., Grand Cayman (KY)

(72) Inventors: Luke G. England, Saratoga Springs, NY (US); Kathryn C. Rivera, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/826,799

(22) Filed: Nov. 30, 2017

(65) Prior Publication Data

US 2018/0233488 A1  Aug. 16, 2018

Related U.S. Application Data

(62) Division of application No. 15/431,915, filed on Feb. 14, 2017, now Pat. No. 9,865,570.

(51) Int. Cl.
*H01L 21/02* (2006.01)
*H01L 21/48* (2006.01)
(Continued)

(52) U.S. Cl.
CPC .... *H01L 25/0657* (2013.01); *H01L 21/02164* (2013.01); *H01L 21/02178* (2013.01); *H01L 21/31053* (2013.01); *H01L 21/4871* (2013.01); *H01L 21/561* (2013.01); *H01L 21/565* (2013.01); *H01L 21/6835* (2013.01); *H01L 21/78* (2013.01); *H01L 23/04* (2013.01); *H01L 23/10* (2013.01); *H01L 23/291* (2013.01); *H01L 23/3107* (2013.01); *H01L 23/367* (2013.01); *H01L 23/3736* (2013.01); *H01L 23/5226* (2013.01); *H01L 24/17* (2013.01); *H01L 24/81* (2013.01); *H01L 25/50* (2013.01);
(Continued)

(58) Field of Classification Search
CPC ..... H01L 2224/32145; H01L 2924/181; H01L 25/0657; H01L 2225/1058; H01L 2224/48145; H01L 2225/06589
See application file for complete search history.

(56) References Cited

U.S. PATENT DOCUMENTS 7,960,827 B1  6/2011  Miller, Jr. et al.
8,097,490 B1  1/2012  Pagaila et al.
(Continued)

OTHER PUBLICATIONS

Office Action and English Translation thereof for Taiwanese Patent Application No. 10721018190 dated Oct. 30, 2018, 9 pages.

*Primary Examiner* — Ngan V Ngo
(74) *Attorney, Agent, or Firm* — Anthony Canale; Hoffman Warnick LLC

(57) ABSTRACT

Embodiments of the present disclosure relate to an integrated circuit (IC) package, including a molding compound positioned on a first die and laterally adjacent to a stack of dies positioned on the first die. The stack of dies electrically couples the first die to an uppermost die, and a thermally conductive pillar extends through the molding compound from the first die to an upper surface of the molding compound. The thermally conductive pillar is electrically isolated from the stack of dies and the uppermost die. The thermally conductive pillar laterally abuts and contacts the molding compound.

18 Claims, 10 Drawing Sheets

(51) Int. Cl.
*H01L 21/56* (2006.01)
*H01L 21/78* (2006.01)
*H01L 23/00* (2006.01)
*H01L 23/04* (2006.01)
*H01L 23/10* (2006.01)
*H01L 23/29* (2006.01)
*H01L 23/31* (2006.01)
*H01L 25/00* (2006.01)
*H01L 21/683* (2006.01)
*H01L 23/367* (2006.01)
*H01L 23/373* (2006.01)
*H01L 23/522* (2006.01)
*H01L 25/065* (2006.01)
*H01L 21/3105* (2006.01)

(52) U.S. Cl.
CPC ............. *H01L 2221/68327* (2013.01); *H01L 2224/13109* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/16146* (2013.01); *H01L 2224/16227* (2013.01); *H01L 2224/32145* (2013.01); *H01L 2224/32225* (2013.01); *H01L 2224/48145* (2013.01); *H01L 2224/73204* (2013.01); *H01L 2224/81005* (2013.01); *H01L 2225/06548* (2013.01); *H01L 2225/06586* (2013.01); *H01L 2225/06589* (2013.01); *H01L 2225/1058* (2013.01); *H01L 2924/14* (2013.01); *H01L 2924/15311* (2013.01); *H01L 2924/181* (2013.01); *H01L 2924/18161* (2013.01)

(56) References Cited

U.S. PATENT DOCUMENTS

| | | |
|---|---|---|
| 9,245,816 B2 | 1/2016 | Jang et al. |
| 9,899,293 B2* | 2/2018 | Groothuis ............ H01L 23/3675 |
| 9,960,197 B1* | 5/2018 | Wu ................... H01L 27/14618 |
| 2007/0164457 A1 | 7/2007 | Yamaguchi et al. |
| 2013/0119528 A1* | 5/2013 | Groothuis ............... H01L 23/36 |
| | | 257/690 |
| 2015/0206866 A1 | 7/2015 | Yu et al. |
| 2015/0279431 A1* | 10/2015 | Li .......................... H01L 25/50 |
| | | 365/51 |
| 2015/0303174 A1 | 10/2015 | Yu et al. |
| 2015/0333026 A1* | 11/2015 | Gandhi ............... H01L 23/4012 |
| | | 257/737 |
| 2015/0348954 A1* | 12/2015 | Chandolu ............... H01L 25/50 |
| | | 257/712 |
| 2016/0118333 A1* | 4/2016 | Lin ........................ H01L 24/97 |
| | | 257/773 |
| 2016/0225692 A1* | 8/2016 | Kim ................... H01L 23/49827 |
| 2016/0276174 A1 | 9/2016 | Kim et al. |
| 2017/0133323 A1 | 5/2017 | Ho et al. |
| 2017/0229439 A1 | 8/2017 | Vadhavkar et al. |
| 2017/0301649 A1 | 10/2017 | Wu |
| 2017/0323840 A1* | 11/2017 | Chiu ....................... H01L 21/78 |
| 2017/0373037 A1* | 12/2017 | Yu ...................... H01L 45/1233 |
| 2018/0005916 A1* | 1/2018 | Chen ................... H01L 23/3675 |
| 2018/0026023 A1* | 1/2018 | Lin ..................... H01L 21/76877 |
| | | 438/109 |
| 2018/0040586 A1* | 2/2018 | Wei ....................... H01L 25/0652 |
| 2018/0040592 A1* | 2/2018 | Gandhi ............... H01L 23/4012 |
| 2018/0076131 A1* | 3/2018 | Hsu ......................... H01L 21/56 |
| 2018/0269127 A1* | 9/2018 | Hung ................... H01L 23/367 |
| 2018/0269145 A1* | 9/2018 | Paek ................ H01L 23/49811 |

* cited by examiner

METHODS OF FORMING INTEGRATED CIRCUIT PACKAGE WITH THERMALLY CONDUCTIVE PILLAR

BACKGROUND

Technical Field

The present disclosure relates to integrated circuit (IC) packages structured to withstand elevated operating temperatures. In particular, embodiments of the present disclosure include IC packages which include one or more thermally conductive pillars extending through a molding compound of the package, and methods of forming the same.

Related Art

In flip chip processing of semiconductor integrated circuit (IC) chips, metal contacts such as controlled collapse chip connect (C4) solder balls can be implemented to connect IC dies to packaging and/or to each other. When formed, each metal contact can provide an electrically conductive structure coupled between directly connected IC chips to serve as a mechanical and electrical connection between the two chips. These components may together define the IC "package," i.e., the housing of a particular chip or device. The package generally includes each element for electrically connecting a particular chip with outside circuitry, and also may be structured to include and/or be coupled to elements which provide physical and chemical protection to active elements of the chip.

During operation of a chip, heat may dissipate from the components of the IC structure to the package. In die-to-wafer assemblies for three-dimensional packaging of ICs, one or more molding compounds may be included for use in subsequent handling and testing. Such molding compounds typically act as a barrier to heat transmission, and in some cases may impede heat transfer from the IC structure to the lid of the packaging. The presence of molding compounds in packaging may therefore be associated with elevated operating temperatures, e.g., relative to product specifications or similarly structured chips without molding compounds therein.

SUMMARY

A first aspect of the disclosure provides an integrated circuit (IC) package including: a molding compound positioned on a first die and laterally adjacent to a stack of dies positioned on the first die, wherein the stack of dies electrically couples the first die to an uppermost die of the stack of dies; and a thermally conductive pillar extending through the molding compound from the first die to an upper surface of the molding compound, wherein the thermally conductive pillar is electrically isolated from the stack of dies and the uppermost die of the stack of dies, and wherein the thermally conductive pillar laterally abuts and contacts the molding compound.

A second aspect of the disclosure provides an integrated circuit (IC) package including: a first die coupled to a plurality of metal contacts; a stack of dies positioned on the first die and electrically coupled to the plurality of metal contacts; a molding compound positioned on the first die and laterally adjacent to the stack of dies; a thermally conductive pillar positioned on the first die and extending through the molding compound to an upper surface thereof, wherein the thermally conductive pillar is electrically isolated from the stack of dies and the plurality of metal contacts, and wherein the thermally conductive pillar laterally abuts and contacts the molding compound; and an uppermost die contacting and overlying the stack of dies, wherein the molding compound electrically isolates the uppermost die of the stack of dies from the thermally conductive pillar.

A third aspect of the disclosure provides a method of forming an integrated circuit (IC) package, the method including: mounting a plurality of metal contacts on a first die, the first die including a plurality of connecting vias coupled to the plurality of metal contacts; forming a thermally conductive pillar on the first die and laterally displaced from the plurality of connecting vias; forming a stack of dies on the plurality of connecting vias, such that the stack of dies is laterally displaced from the thermally conductive pillar; and forming a molding compound on the first die, such that the molding compound laterally and electrically isolates the thermally conductive pillar from the stack of dies, wherein the molding compound laterally abuts and contacts the thermally conductive pillar after being formed.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
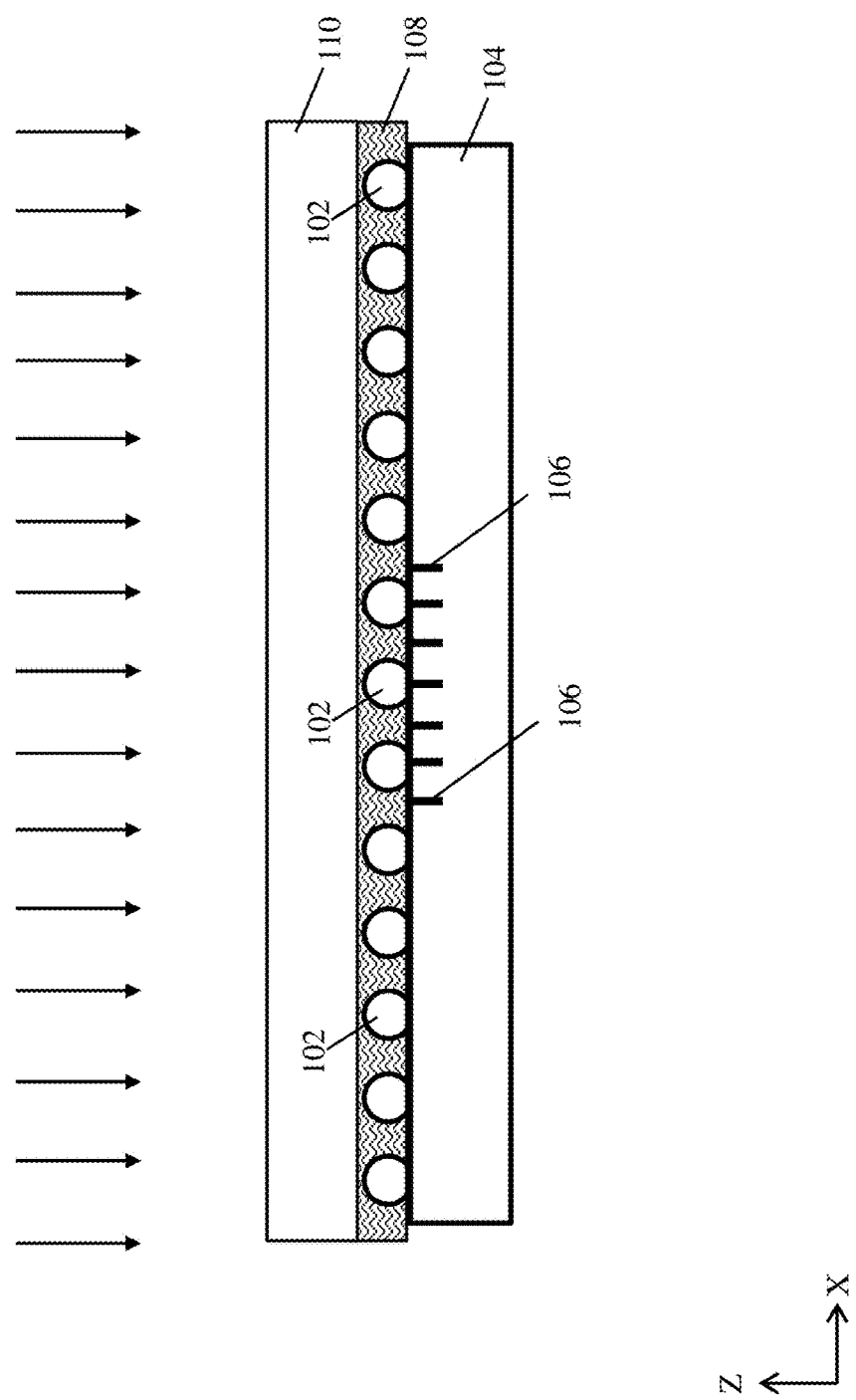
FIG. 1 shows a cross-sectional view in plane X-Z of a plurality of metal contacts being mounted on a first die according to embodiments of the disclosure.

Referring to FIG. 1, the present disclosure relates to integrated circuit (IC) packages including thermally conductive pillars, e.g., to withstand elevated operating temperatures, and methods of forming the same. The various elements discussed herein are depicted in a two-dimensional cross-section in plane X-Z; views of the same or similar elements in different two-dimensional planes or in three-dimensional space are also discussed elsewhere herein. Fabrication techniques according to the disclosure can include mounting a plurality of metal contacts 102 on a first die 104. First die 104 can be at least partially composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Each metal contact 102 mounted on first die 104 may be composed of, e.g., a solder bump including one or more solderable materials, conductive pillars (e.g., metallic pillars with conductive caps, e.g., copper pillars capped with tin), and/or any currently known or later developed conductive material. According to an embodiment, metal contacts 102 may be formed from, e.g., material having tin and lead, tin without lead, tin with a residual of copper or silver, tin bismuth, tin indium, etc. The size of metal contacts 102 can be determined at least in part by the size (e.g., surface area, depth, etc.) of first die 104 and other structures to which metal contacts 102 are connected. For example, one or more metal contacts 102 can be of a different size to accommodate varying current carrying capacity and/or spacing requirements of a product.

As shown, first die 104 can include a plurality of connecting vias 106 therein. Each connecting via 106 can extend at least partially through first die 104 to a contact point, e.g., a connecting pad (not shown), on one surface of first die 104. Metal contacts 102 may then be electrically connected to respective connecting vias 106 by being formed thereon. Each metal contact 102 can be positioned to define an electrical connection to one or more connecting vias 106 and/or connecting pads (not shown) thereunder. Connecting vias 106 may generally include one or more electrically conductive materials etched through semiconductor materials in first die 104 to provide a wafer-to-wafer interconnect scheme compatible with 3D wafer-level packaging, e.g., electrical connections which use metal contacts 102 formed on contact pads to underlying structures, e.g., BEOL dielectric materials and/or other external structures or devices. Each connecting via 106 can be used to connect circuit elements on first die 104 to other components. Connecting vias 106 can include substantially annular refractory metal liners (not shown) disposed circumferentially about their structure for providing additional electrical insulation and for preventing electromigration between connecting vias 106 and adjacent structures in first die 104. Such liners can be composed of any currently known or later developed conductive material, e.g., refractory metals such as ruthenium (Ru), tantalum (Ta), titanium (Ti), tungsten (W), iridium (Ir), rhodium (Rh) and platinum (Pt), etc., or mixtures of thereof. In a particular embodiment, one or more connecting vias 106 within first die 104 can be embodied as a power supply via for transmitting larger amounts of current than other connecting vias 106. As shown in FIG. 1, each connecting via 106 can extend substantially vertically through first die 104 between two axial ends thereof. Although connecting vias 106 are shown to exhibit a substantially columnar shape in the accompanying FIGS., connecting vias 106 may have different structures in further embodiments. More generally, connecting vias 106 may have any desired shape or size, and may include, e.g., one or more electrically connected members which may each have linear profiles, curvilinear profiles, wave-type profiles, irregular profiles, etc.

Additional materials can be formed to shield metal contacts 102, connecting vias 106, and/or other elements from being modified and processed in subsequent fabrication steps described herein. For example, a temporary adhesive insulator 108 can be coated on exposed portions of first die 104 and/or connecting vias 106, e.g., by spin coating and/or film lamination processes for forming a polymer on a material. Adhesive insulator 108 can include one or more electrically insulating materials with adhesive properties. As examples, temporary adhesive insulator 108 can include one or more electrically insulating adhesive materials such as, e.g., urethane, silicone, and/or other adhesive resinous materials. A temporary wafer 110, alternatively identified in the art as a "handle wafer," can also be positioned on metal contacts 102 and adhesive insulator 108 (e.g., by being mechanically placed thereon as shown by accompanying arrows in FIG. 1). Adhesive insulator 108 can mechanically couple first die 104 to temporary wafer 110. Temporary wafer 110 can include any suitable material capable of being mechanically bonded to first die 104, e.g., one or more semiconductor materials included in the composition of first die 104 and/or may include one or more different materials regardless of electrical conductivity (e.g., glass).

Figure 2:
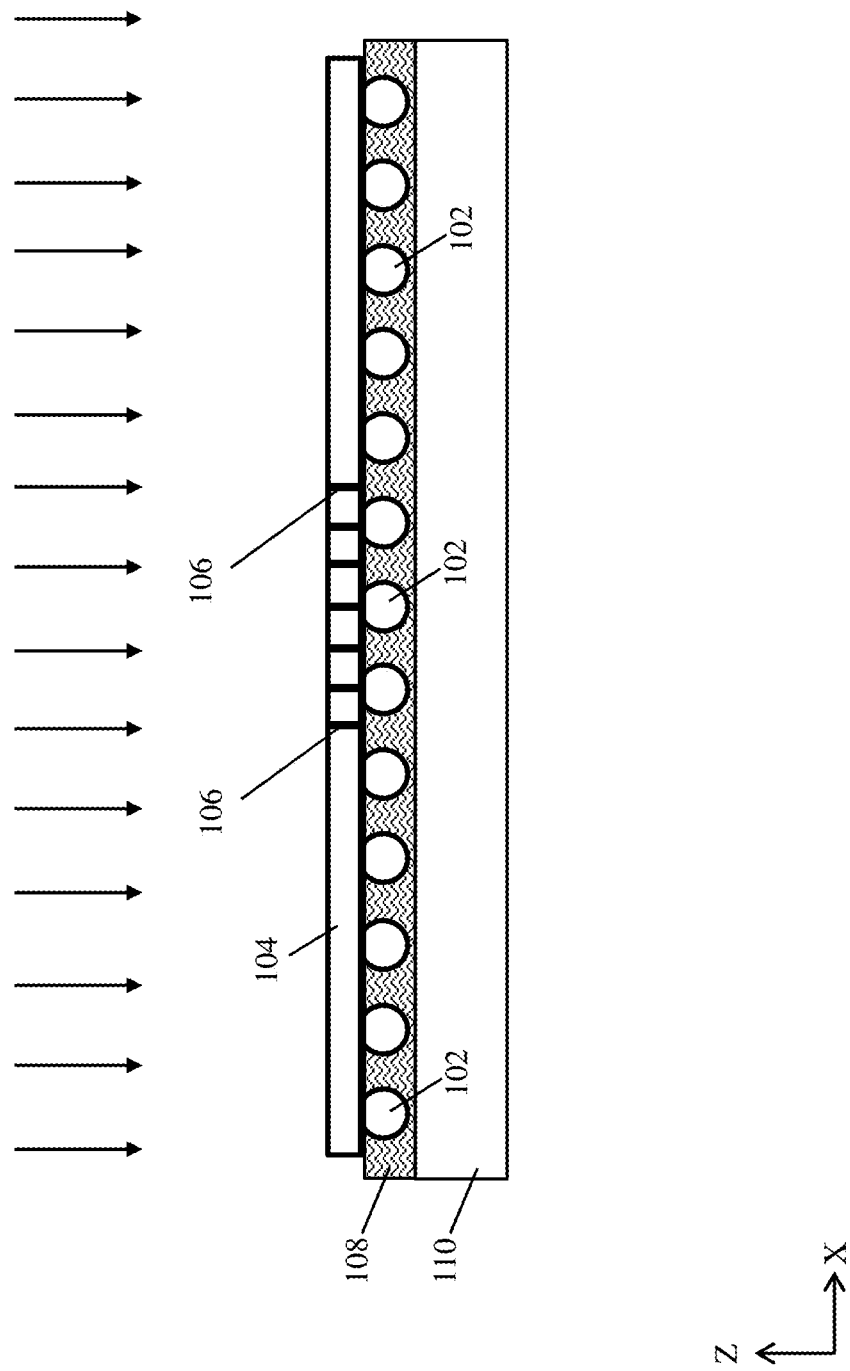
FIG. 2 shows a cross-sectional view in plane X-Z of a first die being processed according to embodiments of the disclosure.

Turning to FIG. 2, the present disclosure can include modifying the structure of first die 104, e.g., to prepare first die 104 for structural elements subsequently formed thereon. In an embodiment, as shown, a fabricator can flip first die 104 and temporary wafer 110 upside-down to expose an opposite surface of first die 104. Semiconductor materials within first die 104 can then be removed, e.g., by backgrinding, followed by dry etch and chemical planar planarization (CMP) or other currently known or later-developed techniques for removing portions of a structure as depicted with the accompanying arrows in FIG. 2. CMP generally refers to any process for removing layers of a solid material by chemical-mechanical polishing, e.g., for surface planarization and definition of metal interconnect patterns. After being processed as shown in FIG. 2, connecting vias 106 can extend through first die 104 between opposing surfaces. First die 104 may have a thickness of e.g., approximately fifty micrometers (μm) between opposing vertical sides after being planarized. Thus, an upper surface of first die 104 can be substantially coplanar with the upper surfaces of exposed connecting vias 106.

Figure 3:
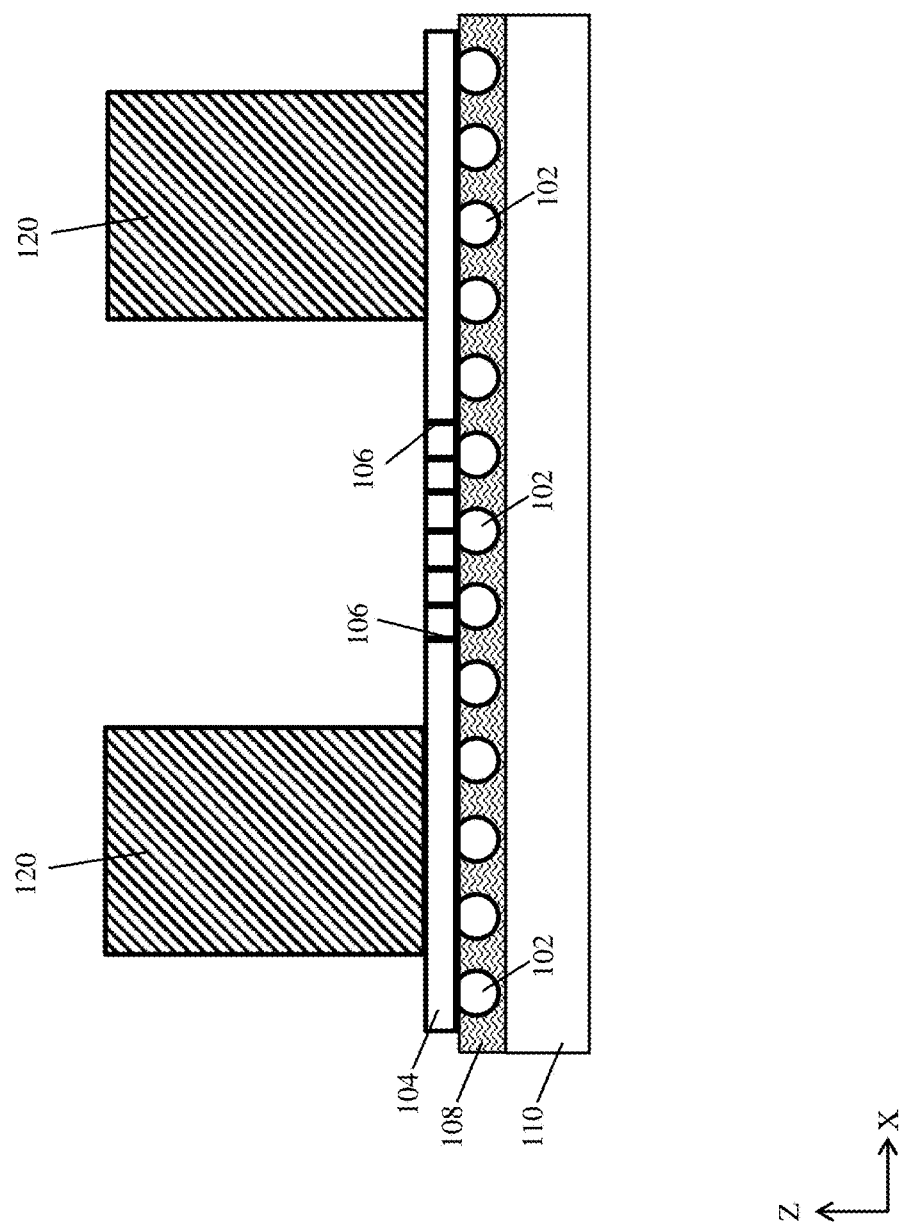
FIG. 3 shows a cross-sectional view in plane X-Z of thermally conductive pillars being formed on a first die according to embodiments of the disclosure.

Turning to FIG. 3, the present disclosure can include forming one or more thermally conductive pillar(s) 120 on first die 104. Thermally conductive pillar(s) 120 can be structured to provide thermal communication from first die 104, e.g., to divert heat from first die 104 to other structures during operation of an IC device. Each thermally conductive pillar 120 can include one or more thermally conductive metals and/or other materials for transmitting heat. According to an example, thermally conductive pillar(s) 120 can include copper (Cu), aluminum (Al), and/or other conductive materials. Thermally conductive pillar 120 can be formed on an area of first die 104 that is electrically isolated from connecting vias 106. As shown, each thermally conductive pillar(s) 120 can be laterally displaced from connecting via(s) 106 on first die 104, and thus electrically separated from each connecting via 106. Although thermally conductive pillar(s) 120 may in some cases be at least partially vertically aligned with metal contacts 102 on an opposing side of first die 102, thermally conductive pillar(s) 120 nevertheless may be positioned for electrical isolation from connecting vias 106 and metal contacts 102 coupled thereto. Thermally conductive pillar(s) 120 can be formed, e.g., by electroplating, depositing, and/or otherwise forming a conductive material on first die 104. "Electroplating" generally refers to a process in which thin layers of metal are plated on the surface of a biased wafer structure (e.g., first die 104) immersed in an electrolyte which contains metal ions therein. Electroplating can form materials selectively on one or more seed layers which may have been formed previously, e.g., by deposition. As used herein, "deposition" or "depositing" a material (e.g., thermally conductive pillar(s) 120) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed.

Figure 4:
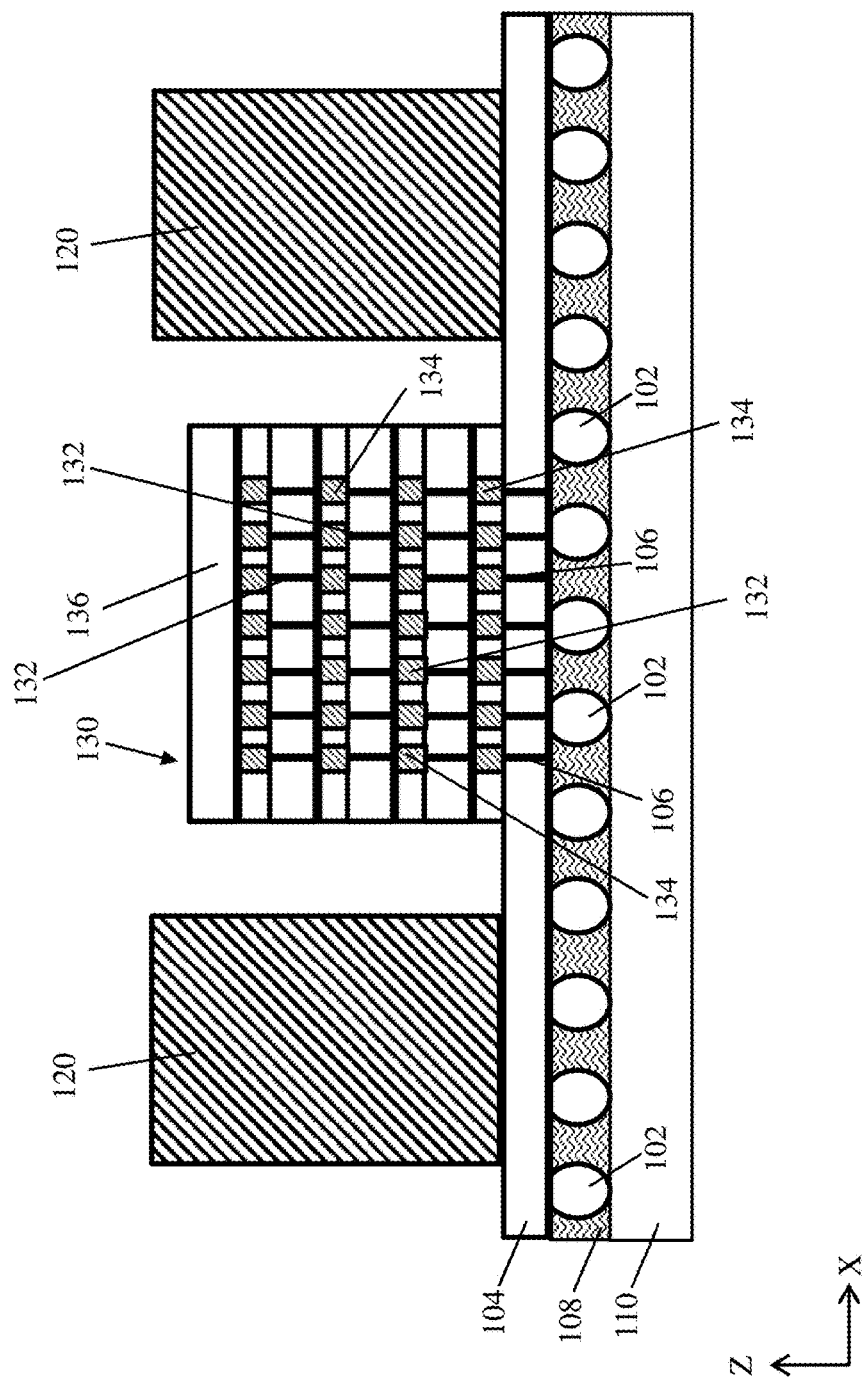
FIG. 4 shows a cross-sectional view in plane X-Z of a stack of dies being formed on a first die according to embodiments of the disclosure.

Turning to FIG. 4, embodiments of the disclosure can include forming a group of stacked dies 130 to connecting vias 106 of first die 104 after thermally conductive pillar(s) 120 have been formed. As shown, stacked dies 130 may include one or more electrical couplings to metal contacts 102 through connecting vias 106 of first die 104. Stacked dies 130 can be fabricated by way of any currently known or later-developed process of forming a stack of dies including, metal wires, etc., in conventional IC package fabrication. As an example, stacked dies 130 can be formed by way of sequential die-to-wafer stacking of wiring layers in a dielectric material (e.g., one or more inter-level dielectric materials (ILDs)) on top of first die 104. Stacked dies 130 can thus include metal wires 132 arranged in successive layers, with vias 134 extending through insulator material and connecting metal wires 132 together. The configuration of metal wires 132 and vias 134 depicted in FIG. 4 illustrates an example arrangement, and alternative arrangements of metal wires 132 and vias 134 are contemplated in embodiments of the disclosure.

Stacked dies 130 can include an uppermost die 136 positioned on an upper surface thereof, e.g., to define an uppermost layer and/or electrical connection to other structures or contacts. Uppermost die 136 may include, among other things, one or more of the semiconductive materials described herein relative to first die 104 and/or may include other semiconductor materials. Uppermost die 136 can optionally include, e.g., electrically conductive wires, vias, contacts, etc. (not shown) to electrically connect underlying structures together. Uppermost die 136 can also have a greater thickness than that of first die 104, e.g., to accommodate materials being removed therefrom in subsequent processes. Regardless of any chosen design and arrangement, stacked dies 130 can be laterally separated and electrically isolated from thermally conductive pillar(s) 120. Although stacked dies 130 is discussed as being formed after thermally conductive pillar(s) 120 for the purposes of example, it is understood that stacked dies 130 can be formed on connecting vias 106 of first die 104 before thermally conductive pillar(s) 120 in alternative embodiments.

Figure 5:
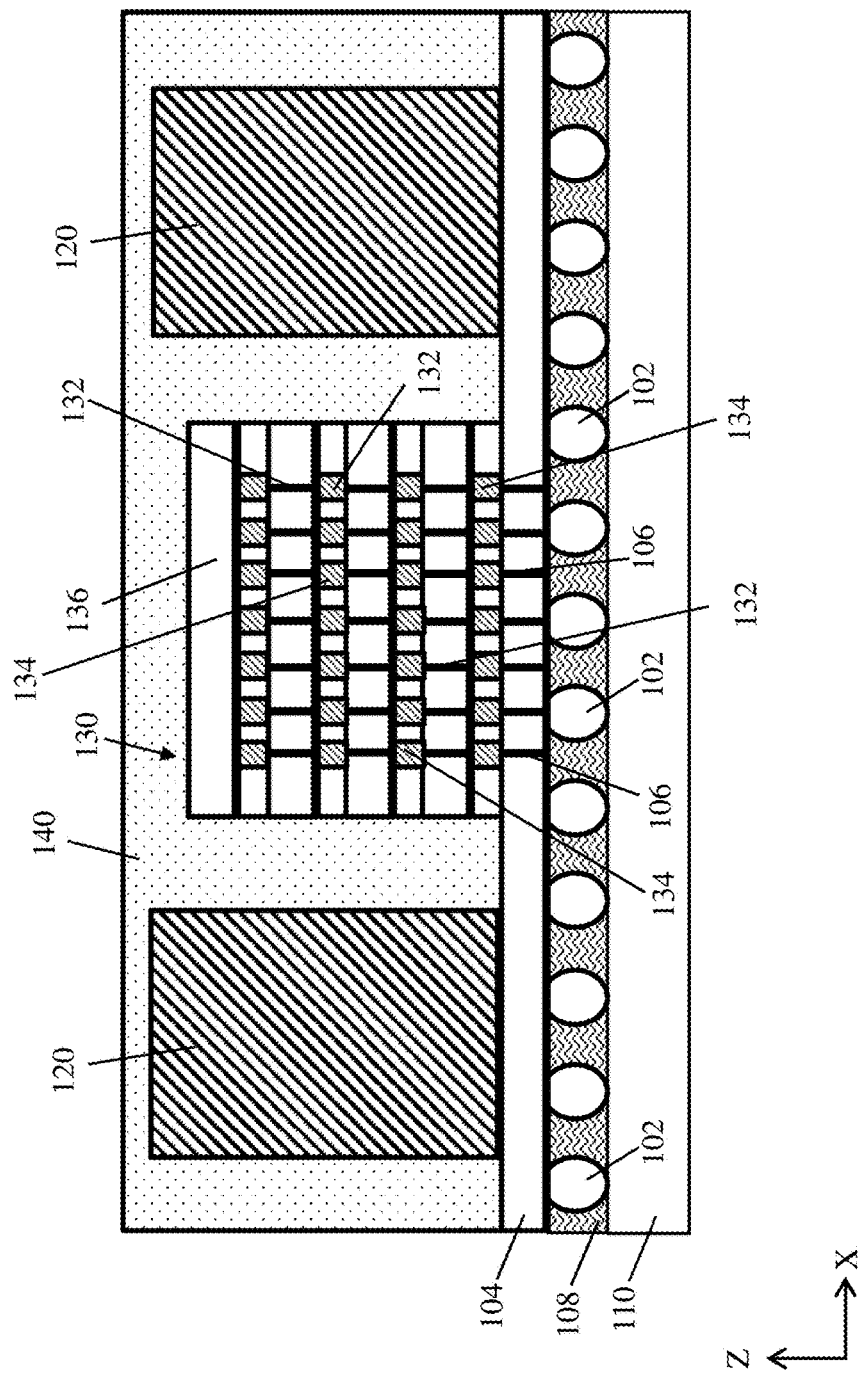
FIG. 5 shows a cross-sectional view in plane X-Z of an array of a molding compound being formed on a first die according to embodiments of the disclosure.

Referring now to FIG. 5, embodiments of the disclosure can include forming a molding compound 140 on first die 104. Forming molding compound 140 on first die 104 can bury thermally conductive pillar(s) 120 and stacked dies 130 thereunder. Molding compound 140 can include, e.g., one or more electrically insulative resinous materials including without limitation: silicon dioxide ($SiO_2$), aluminum oxide ($Al_2O_3$), or other molding compounds having similar properties. Molding compound 140 can be formed on first die 104, thermally conductive pillar(s) 120 in an uncured, liquid phase before being treated or otherwise allowed to cure into a solid phase on the underlying structures. However embodied, molding compound 140 can laterally abut and contact thermally conductive pillar(s) 120 without intervening materials being positioned laterally therebetween. That is, in contrast to other conductive structures such as through-semiconductor vias (TSVs), thermally conductive pillar(s) 120 can lack refractory metal liners and/or other structures separating its material composition from molding compound 140. Molding compound 140 can thus physically and electrically separate thermally conductive pillar(s) 120 from other structures configured to transmit electrical currents therethrough, e.g., connecting vias 106 and stacked dies 130. After molding compound 140 is formed, the total height of thermally conductive pillar(s) 120, uppermost die 136, and/or molding compound 140 above first die 104 can be greater than a specified height for each structural element in a final IC package.

Figure 6:
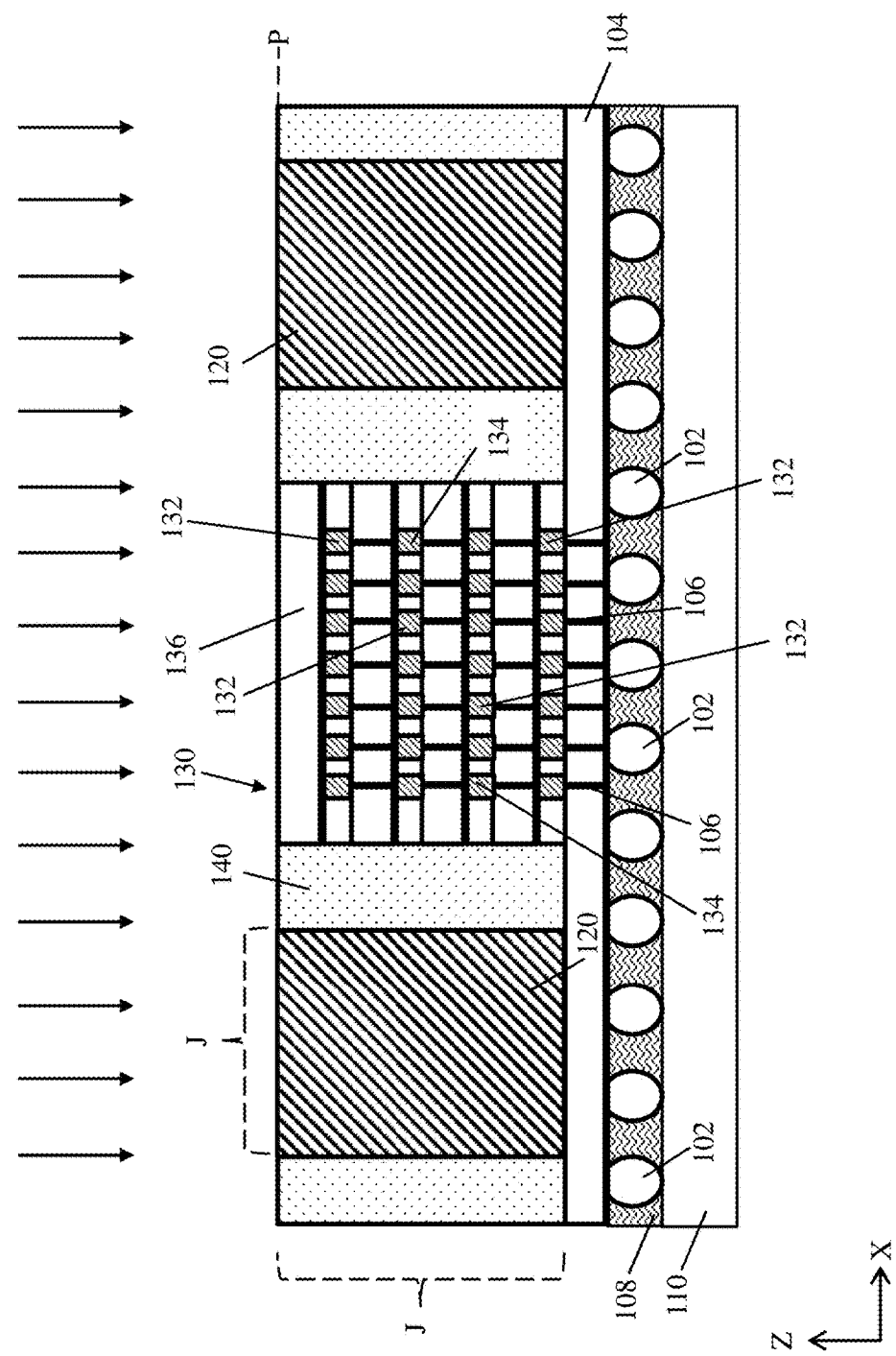
FIG. 6 shows a cross-sectional view in plane X-Z of a molding compound being planarized according to embodiments of the disclosure.

Turning to FIG. 6, methods according to the present disclosure can include modifying the previously formed structures to yield a predetermined size and shape for subsequent use in an IC package. For example, embodiments of the disclosure can include planarizing molding compound 140 and other structures positioned thereunder. As depicted with arrows in FIG. 6, the disclosure can include planarizing molding compound 140 along with thermally-conductive pillar(s) 120 and/or stacked dies 130, e.g., by mechanical grinding and/or other processes for yielding a planarized upper surface from a precursor structure. Such processes can remove exposed portions of molding compound 140 and further may partially decrease the thickness of materials positioned thereunder. An upper surface of molding compound 140 may be substantially coplanar with the upper surface of thermally-conductive pillar(s) 120 and stacked dies 130, e.g., along reference line P of FIG. 6, after the planarization ends. The amount of planarization and/or corresponding length of time can be controlled to produce a predetermined size of various components, e.g., thermally conductive pillar(s) 120 and stacked dies 130, to meet predetermined specifications. In an example embodiment, thermally conductive pillar(s) 120 can extend to a height of at least approximately 250 µm, e.g., approximately 300 µm, above first die 104. The aspect ratio of diameter-to-height for each thermally conductive pillar 120 can be shaded to accommodate the size and shape of stacked dies 130. For example, where stacked dies include a total of, e.g., four dies, the aspect ratio of diameter-to-height for each thermally conductive pillar 120 may be approximately one-to-one, e.g., as shown by a diameter and height of thermally conductive pillar 120 being of approximately the same diameter J. In other cases, e.g., eight dies being included in stacked dies 130, the aspect ratio of diameter-to-height for each thermally conductive pillar may be adjusted accordingly, e.g., up to approximately two-to-one. Thus, the size and dimensional proportions of each thermally conductive pillar 120 can be structurally distinct from conventional conducting structures in an IC, e.g., vias, TSVs, etc., in addition to being operationally distinguishable from such structures.

Figure 7:
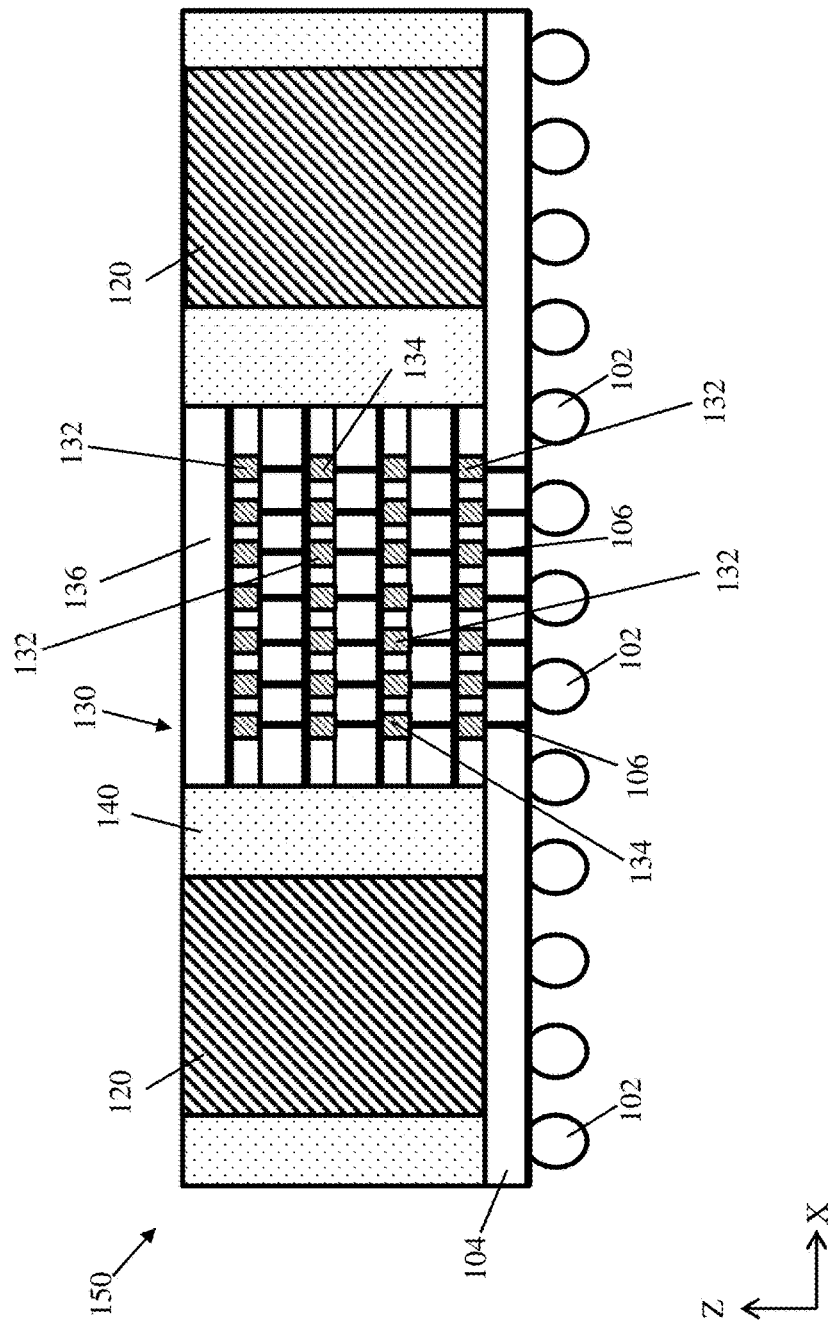
FIG. 7 shows a cross-sectional view in plane X-Z of a temporary wafer being removed to expose metal contacts according to embodiments of the disclosure.

Turning to FIG. 7, the present disclosure can include removing the various structures discussed herein from temporary wafer 110 (FIGS. 1-6). In particular, temporary wafer 110 can be separated from metal contacts 102 to expose adhesive insulator 108 (FIGS. 1-6). Temporary wafer 110 can be removed from metal contacts 102, e.g., by any currently known or later-developed wafer separation technique (e.g., chemical and/or mechanical wafer separation). Adhesive insulator 108 can also be removed by any currently known or later-developed process for removing an insulative material from a structure, e.g., chemical dissolution, selective or non-selective etch, etc. Removing adhesive insulator 108 and temporary wafer 110 can allow metal contacts 102 to be joined to a packaging structure pursuant to any currently-known or later developed process flow for joining circuits together at a soldered interconnect, e.g., a flip chip processing scheme. In any event, embodiments of the disclosure discussed herein can yield an IC package 150 to be integrated in a larger IC structure.

During operation, thermal energy accumulated within first die 104, stacked dies 130, etc., can escape to the environment and/or other structures by being communicated through thermally conductive pillar(s) 120 housed within molding compound 140. In conventional devices, the temperature of a first die in a conventional package may approach or exceed threshold limits (e.g., thirty or more degrees Celsius (° C.) above a specified operation temperature) due to the thermal insulation of molding compound 140. IC package 150 with thermally conductive pillar(s) 120 therein, can reduce the operating temperature of first die 104 to less than such threshold values by providing a thermal pathway between first die 104 and one or more heat sinks, e.g., package lid 170 discussed elsewhere herein. Furthermore, thermally conductive pillar(s) 120 can be structurally integrated into IC package 150 with few modifications to conventional processing techniques as demonstrated herein.

Figure 8:
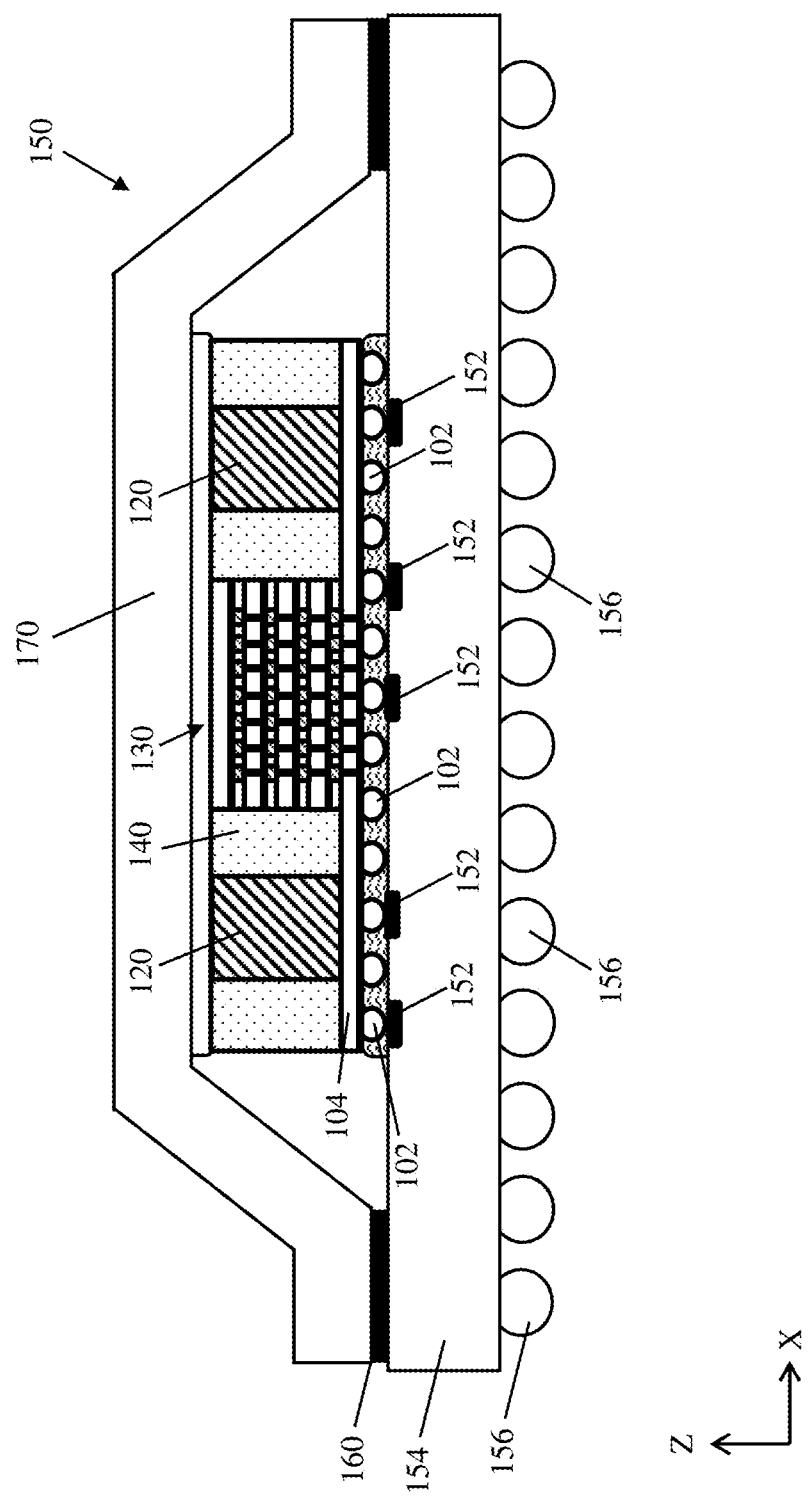
FIG. 8 shows a cross-sectional view in plane X-Z of an integrated circuit (IC) package according to embodiments of the disclosure.
Figure 9:
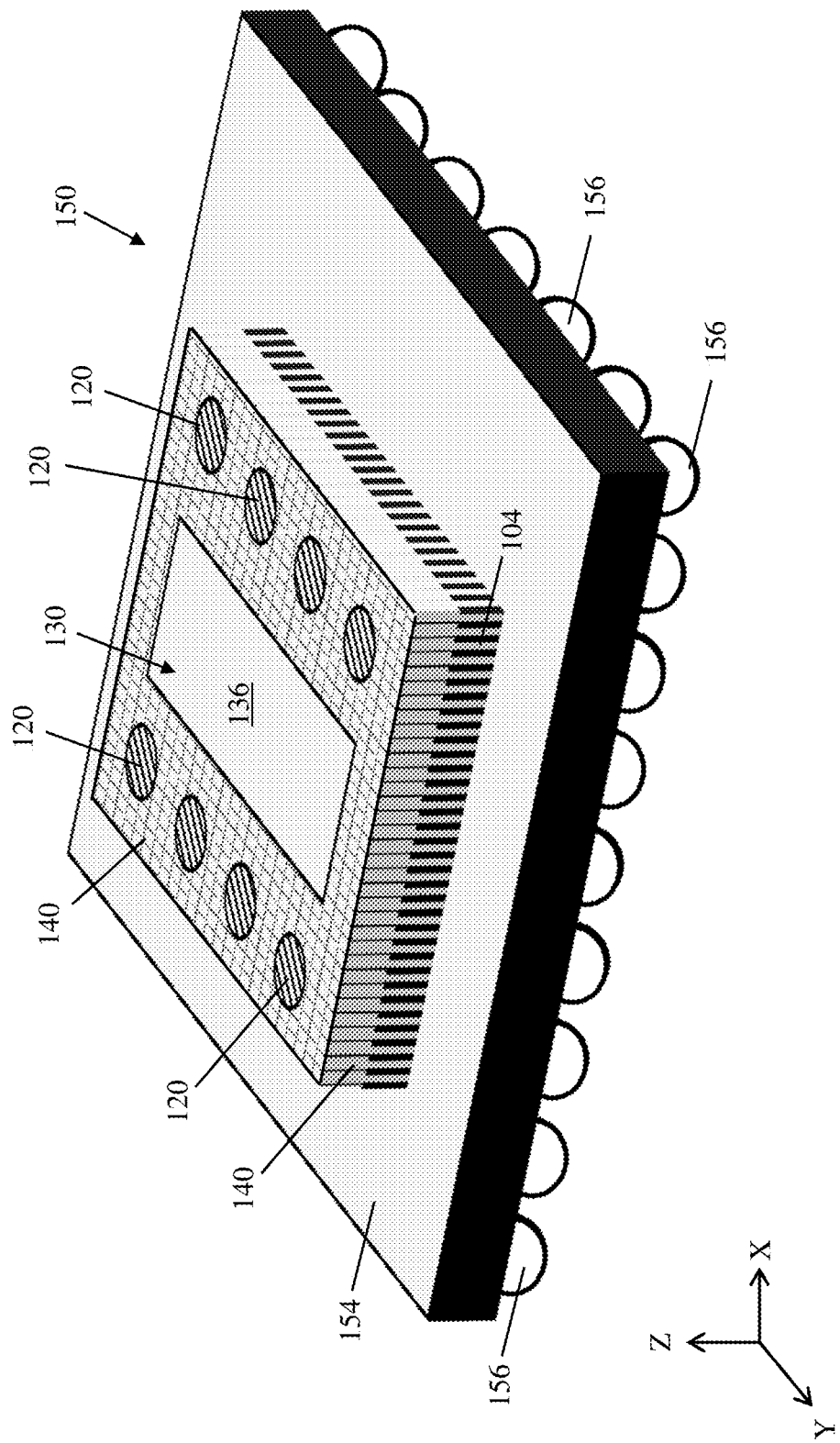
FIG. 9 shows a perspective view of an integrated circuit (IC) package according to embodiments of the disclosure.

Referring to FIGS. 8 and 9 together, IC package 150 is shown to be integrated with various structural elements to form a larger structure. A cross-sectional view of IC package 150 is shown in plane X-Z in FIG. 8. FIG. 9 depicts IC package 150 in a three-dimensional (X-Y-Z) space for further illustration. As discussed herein, IC package 150 can include molding compound 140 positioned on first die 104, and laterally adjacent to stacked dies 130 positioned on first die 104. Stacked dies 130 can electrically couple first die 104 to uppermost die 136 as discussed herein. One or more thermally conductive pillars 120 can extend through molding compound 140 from first die 104 to an upper surface thereof, with each thermally conductive pillar 120 being electrically isolated from stacked dies 130 and uppermost die 136. Nevertheless, thermally conductive pillar(s) 120 can laterally abut and contact molding compound 140, thereby conducting heat from first die 104 of IC package 150.

Metal contacts 102 can be positioned in contact with a corresponding set of interconnect pads 152 (FIG. 8) on an organic laminate 154, e.g., one or more printed circuit boards (PCBs), positioned directly beneath first die 104. Organic laminate 154 can further include electrical circuits and/or other conductive elements (not shown) to electrically couple first die 104 to other elements of an IC structure. Organic laminate 154 itself may include one or more solder bumps 156 for providing an electrical connection to external elements. Solder bumps 156 of organic laminate 154 can be larger in size relative to metal contacts 102, e.g., to suit one or more design specifications or constraints. It is understood that metal contacts 102, 156 may be completely or partially melted during fabrication to increase the mechanical and/or electrical bonding between IC package 150 and circuit elements connected thereto. Further, it is understood that one or more adhesive insulators may be formed in contact with and/or proximal to metal contacts 102, 156 to increase structural bonding as discussed herein relative to temporary wafer 110 (FIGS. 1-6).

Referring to FIG. 8 only, additional structures can be provided to structurally protect and/or conceal IC package 150. For example, an adhesive coating 160 can be formed on a portion and/or outer circumference of organic laminate 154. Adhesive coating 160 can include one or more materials included in the composition of adhesive insulator 108 (FIGS. 1-6) discussed elsewhere herein, and/or may include any other currently known or later-developed material for bonding two structural elements of an IC device together. A package lid 170 can be mechanically coupled to organic laminate 154 through adhesive coating 160. Package lid 170 can include, e.g., one or more metallic and/or ceramic materials configured for bonding to organic laminate 154 through adhesive coating 160 and/or through one or more brazed couplings, seals, and/or other structural bonding techniques.

Figure 10:
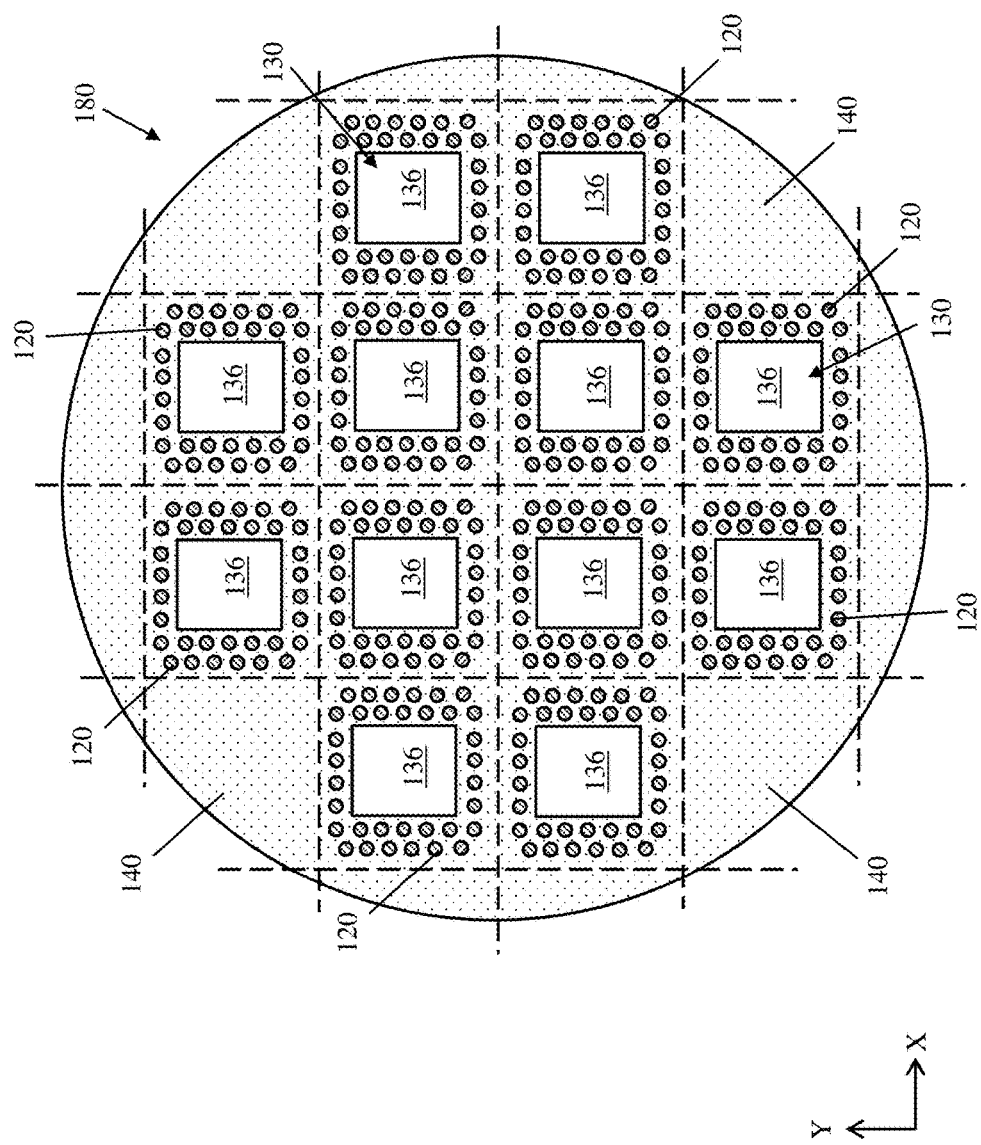
FIG. 10 shows a plan view in plane X-Y of an integrated circuit (IC) package being diced from a wafer according to embodiments of the disclosure.

Turning to FIG. 10, multiple IC packages 150 can be formed by separating components thereof from a larger structure, e.g., subsequent to the various fabrication techniques discussed herein. As shown in the plan view within plane X-Y of FIG. 10, a single wafer structure 180 can be fabricated to include molding compound 140, multiple thermally conductive pillars 120, multiple stacks of dies 130 each having an uppermost die 136 positioned thereon. The various structures included in wafer structure 180 can be grouped together for inclusion within individual product units, e.g., along phantom lines which group one uppermost die 136 together with nearby portions of molding compound 140 and groups of thermally conductive pillars 120 formed therein. Despite the inclusion of thermally conductive pillars 120 within molding compound 140, a fabricator can dice wafer structure 180 into individual IC packages 150, e.g., by any currently known or later-developed procedure for dividing a wafer into single product units. Each IC package 150 can thereafter be connected to other structural and/or package elements as described herein relative to FIGS. 8-9. Although one wafer structure 180 is shown by example in FIG. 10 as being diced into twelve units with thermally conductive pillars 120 therein, wafer structure 180 can be sized and shaped to include any desired number of units (e.g., twenty units, fifty units, one hundred units, one thousand units, etc.).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) package, the method comprising:
   mounting a plurality of metal contacts on a first die, the first die including a plurality of connecting vias coupled to the plurality of metal contacts, wherein mounting the plurality of metal contacts on the first die includes:
      coupling the first die having the plurality of connecting vias to a temporary wafer, the plurality of metal contacts being positioned between the first die and the temporary wafer; and
      removing portions of the first die to expose the plurality of connecting vias, such that an upper surface of the first die is substantially coplanar with an upper surface of the plurality of connecting vias;
   forming a thermally conductive pillar on the first die and laterally displaced from the plurality of connecting vias;
   forming a stack of dies on the plurality of connecting vias, such that the stack of dies is laterally displaced from the thermally conductive pillar;
   forming a molding compound on the first die, such that the molding compound laterally and electrically isolates the thermally conductive pillar from the stack of dies, wherein the molding compound laterally abuts and contacts the thermally conductive pillar after being formed; and
   dicing the thermally conductive pillar and the stack of dies from a wafer structure.

2. The method of claim 1, further comprising removing the temporary wafer from the plurality of metal contacts.

3. The method of claim 1, wherein the thermally conductive pillar comprises one of copper (Cu) or aluminum (Al).

4. The method of claim 1, wherein the molding compound comprises a resinous material having one of silicon dioxide ($SiO_2$) or aluminum oxide ($Al_2O_3$) therein.

5. The method of claim 1, wherein forming the molding compound on the first die includes:
   forming the molding compound on the first die, the thermally conductive pillar, and the stack of dies; and
   planarizing the molding compound such that an upper surface of the molding compound is substantially coplanar with an upper surface of the thermally conductive pillar and the stack of dies.

6. The method of claim 1, wherein forming the thermally conductive pillar includes electroplating the thermally conductive pillar to the first die.

7. A method of forming an integrated circuit (IC) package, the method comprising:
   mounting a plurality of metal contacts on a first die, the first die including a plurality of connecting vias coupled to the plurality of metal contacts, wherein mounting the plurality of metal contacts on the first die includes:
      coupling the first die having the plurality of connecting vias to a temporary wafer, the plurality of metal contacts being positioned between the first die and the temporary wafer; and
      removing portions of the first die to expose the plurality of connecting vias, such that an upper surface of the first die is substantially coplanar with an upper surface of the plurality of connecting vias;
   electroplating a thermally conductive pillar onto the first die, wherein the thermally conductive pillar is laterally displaced from the plurality of connecting vias;
   forming a stack of dies on the plurality of connecting vias, such that the stack of dies is laterally displaced from the thermally conductive pillar; and forming a molding compound on the first die, such that the molding compound laterally and electrically isolates the thermally conductive pillar from the stack of dies, wherein the molding compound laterally abuts and contacts the thermally conductive pillar after being formed.

8. The method of claim 7, further comprising removing the temporary wafer from the plurality of metal contacts.

9. The method of claim 7, wherein the thermally conductive pillar comprises one of copper (Cu) or aluminum (Al).

10. The method of claim 7, wherein the molding compound comprises a resinous material having one of silicon dioxide ($SiO_2$) or aluminum oxide ($Al_2O_3$) therein.

11. The method of claim 7, further comprising dicing the thermally conductive pillar and the stack of dies from a wafer structure.

12. A method of forming an integrated circuit (IC) package, the method comprising:
  mounting a plurality of metal contacts on a first die, the first die including a plurality of connecting vias coupled to the plurality of metal contacts, wherein mounting the plurality of metal contacts on the first die includes:
    coupling the first die having the plurality of connecting vias to a temporary wafer, the plurality of metal contacts being positioned between the first die and the temporary wafer, and
    removing portions of the first die to expose the plurality of connecting vias, such that an upper surface of the first die is substantially coplanar with an upper surface of the plurality of connecting vias;
  forming a thermally conductive pillar on the first die and laterally displaced from the plurality of connecting vias;
  forming a stack of dies on the plurality of connecting vias, such that the stack of dies is laterally displaced from the thermally conductive pillar; and
  forming a molding compound on the first die, such that the molding compound laterally and electrically isolates the thermally conductive pillar from the stack of dies, wherein the molding compound laterally abuts and contacts the thermally conductive pillar after being formed.

13. The method of claim 12, further comprising removing the temporary wafer from the plurality of metal contacts.

14. The method of claim 12, wherein the thermally conductive pillar comprises one of copper (Cu) or aluminum (Al).

15. The method of claim 12, wherein the molding compound comprises a resinous material having one of silicon dioxide ($SiO_2$) or aluminum oxide ($Al_2O_3$) therein.

16. The method of claim 12, wherein forming the molding compound on the first die includes:
  forming the molding compound on the first die, the thermally conductive pillar, and the stack of dies; and
  planarizing the molding compound such that an upper surface of the molding compound is substantially coplanar with an upper surface of the thermally conductive pillar and the stack of dies.

17. The method of claim 12, wherein forming the thermally conductive pillar includes electroplating the thermally conductive pillar to the first die.

18. The method of claim 12, further comprising dicing the thermally conductive pillar and the stack of dies from a wafer structure.

* * * * *